(12) United States Patent
Song et al.

(10) Patent No.: US 10,025,347 B2
(45) Date of Patent: Jul. 17, 2018

(54) DISPLAY APPARATUS

(71) Applicant: LG ELECTRONICS INC., Seoul (KR)

(72) Inventors: Hyuncheol Song, Seoul (KR); Kyueung Lee, Seoul (KR); Inwan Choi, Seoul (KR); Jinsu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/052,425

(22) Filed: Feb. 24, 2016

(65) Prior Publication Data

US 2016/0224059 A1 Aug. 4, 2016

Related U.S. Application Data (63) Continuation of application No. 14/459,804, filed on Aug. 14, 2014, now Pat. No. 9,304,539.

(30) Foreign Application Priority Data

Jan. 2, 2014 (KR) .................. 10-2014-0000346

(51) Int. Cl.
| | |
|---|---|
| *H05K 7/00* | (2006.01) |
| *H05K 5/00* | (2006.01) |
| *G06F 1/16* | (2006.01) |
| *G09F 9/30* | (2006.01) |
| *G09F 15/00* | (2006.01) |
| *G09F 19/02* | (2006.01) |
| *H04M 1/02* | (2006.01) |
| *H04N 5/64* | (2006.01) |
| *H04N 5/655* | (2006.01) |
| *G02F 1/1333* | (2006.01) |

(52) U.S. Cl.
CPC .......... *G06F 1/1601* (2013.01); *G06F 1/1652* (2013.01); *G09F 9/301* (2013.01); *G09F 15/0025* (2013.01); *G09F 19/02* (2013.01); *H04M 1/0268* (2013.01); *H04N 5/64* (2013.01); *H04N 5/655* (2013.01); *G02F 1/133305* (2013.01); *G09G 2380/02* (2013.01); *H01L 2251/5338* (2013.01)

(58) Field of Classification Search
CPC ....................................................... H05K 5/03
USPC .................................................... 361/679.21
See application file for complete search history.

(56) References Cited

U.S. PATENT DOCUMENTS

| | | | | |
|---|---|---|---|---|
| 2013/0010405 A1* | 1/2013 | Rothkopf | ............ | H04M 1/0216 361/679.01 |
| 2013/0155655 A1* | 6/2013 | Lee | .......... | H05K 5/03 362/97.1 |
| 2013/0321740 A1* | 12/2013 | An | ........ | H05K 5/0217 349/58 |

FOREIGN PATENT DOCUMENTS

| | | |
|---|---|---|
| CN | 102239683 A | 11/2011 |
| CN | 103489380 A | 1/2014 |
| EP | 2674807 A1 | 12/2013 |

(Continued)

*Primary Examiner* — Jerry Wu
(74) *Attorney, Agent, or Firm* — Dentons US LLP (57) ABSTRACT

A display apparatus includes a display panel to display an image, and a variable member to vary a shape of the display panel such that the display panel transforms from at least a first state to a second state, the display panel is bent in the second state. At least one portion of the display panel has a different curvature than another portion of the display panel in the second state.

17 Claims, 5 Drawing Sheets

(56) References Cited

FOREIGN PATENT DOCUMENTS

KR    0-2010-0113869 A    10/2010

* cited by examiner

DISPLAY APPARATUS

CROSS-REFERENCE TO RELATED APPLICATION

This application is a continuation application of U.S. patent application Ser. No. 14/459,804 filed Aug. 14, 2014, now allowed, which claims benefit of priority to Korean Application No. 10-2014-0000346 filed Jan. 2, 2014 in the Korean Intellectual Property Office, both of which are incorporated herein by reference in its entirety.

BACKGROUND

1. Field of the Disclosure

The present disclosure relates to a display apparatus and more particularly, to a display apparatus having an improved configuration.

2. Background

Various shapes of display apparatuses to display an image are used. For instance, there are a variety of display apparatuses, such as a liquid crystal display panel, a plasma display panel, an organic light emitting diode display panel, and the like.

As usage of display apparatuses has gradually been extended to various fields, various characteristics are required in the respective fields, and demands in consideration of basic characteristics associated with image display as well as three-dimensional effects, immersiveness, and the like are increasing. To satisfy these various requirements, research to achieve various improved configurations of display apparatuses has been ongoing.

SUMMARY

One object is to provide a display apparatus having an improved configuration to enhance watching experience.

In accordance with one aspect, the above and other objects can be accomplished by the provision of a display apparatus including a display panel to display an image, and a variable member to vary a shape of the display panel such that the display panel transforms from at least a first state to a second state, the display panel is bent in the second state, wherein at least one portion of the display panel has a different curvature than another portion of the display panel in the second state.

The display panel may be bent in the second state such that a cross section of the display panel perpendicular to a first direction corresponding to a vertical height direction of the display panel has a curvature.

The curvature of the display panel in the second state may be less, at an edge portion, than that at a center portion in a second direction crossing the first direction.

The curvature of the display panel in the second state may be gradually reduced with increasing distance from the center portion or decreasing distance to the edge portion in the second direction.

The display panel is bent in the second state such that a cross section of the display panel in the first direction has a curvature, and the curvature may be, at an edge portion, equal to or greater than that at a center portion in the first direction.

The curvature of the display panel in the second state may be gradually increased with increasing distance from the center portion or decreasing distance to the edge portion in the first direction.

If an area including a center of the display panel and extending in a second direction crossing the first direction is a first row, and an area including the center of the display panel and extending in the first direction is a first column, and if, in the second state, a difference of curvatures between a center portion and an edge portion of the display panel in the first row is a first difference, and a difference of curvatures between a center portion and an edge portion of the display panel in the first column is a second difference, the first difference may be greater than the second difference.

The display panel may be bent in the second state such that a cross section thereof perpendicular to a first direction has a curvature, and, if the display panel is divided into a plurality of virtual areas in the second state, at least two virtual areas may have different horizontal curvatures.

The virtual areas may include a first row including the center of the display panel and extending in a second direction crossing the first direction to include an edge portion of the display panel, a first column crossing the center portion of the first row in the first direction and a second column crossing the edge portion of the first row in the first direction, and, a curvature of the first column may be greater than a curvature of the second column.

The virtual areas may further include at least one third column in the first direction located between the first column and the second column, and wherein, the curvature of the at least one third column may be less than the curvature of the first column and greater than the curvature of the second column.

The at least one third column may include a plurality of third columns, and curvatures of the respective third columns may be gradually reduced with increasing distance from the first column or decreasing distance to the second column.

The virtual areas may include a second row that does not include the center of the display panel and extending in a second direction crossing the first direction to include an edge portion of the display panel, a first column crossing the center portion of the second row in the first direction and a second column crossing the edge portion of the second row in the first direction, and, a curvature of the first column may be greater than a curvature of the second column.

The virtual areas may include a first row including the center of the display panel and extending in a second direction crossing the first direction, and a second row including the edge of the display panel and extending in the second direction, a first column crosses each of the first row and the second row and may include the center of the display panel and a second column crosses each of the first row and the second row and includes the edge of the display panel in the second direction, and a curvature of a portion of the first column of the second row may be equal to or greater than a curvature of a portion of the first column of the first row.

A curvature of a portion of the second column crossing the second row may be equal to or greater than a curvature of a portion of the second column crossing the first row.

The virtual areas may include a first row including the center of the display panel and extending in a second direction crossing the first direction, and a second row including the edge of the display panel and extending in the second direction, a first column crosses each of the first row and the second row and may include the center of the display panel and a second column crosses each of the first row and the second row and includes the edge of the display panel in the second direction, and, if a difference of curvatures between the first column and the second column crossing the first row is a first difference and a difference of curvatures between the first row and the second row crossing the first column is a second difference, the first difference may be greater than the second difference.

The variable member may extend lengthwise in a second direction crossing the first direction, and the variable member may be bent in the second state with a curvature.

The curvature of a center portion of the variable member may be greater than the curvature of an edge portion of the variable member in the second state.

The first state may be a planar state of the display panel, and, in the first state of the display panel, the variable member may be tilted towards the display panel such that a distance between the variable member and the display panel is less, at an edge portion of the variable member, than that at a center portion of the variable member in the second direction.

The display apparatus may further include a support member provided between the display panel and the variable member to support the display panel, the variable member may include a first part and a second part spaced apart from each other by a distance, and the display apparatus may further include a guide member provided on each of the first and second parts, the guide member serving to movably secure the variable member to the support member.

BRIEF DESCRIPTION OF THE DRAWINGS

The above and other objects, features and other advantages will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings. However, it will be understood that the present invention should not be limited to the embodiments and may be modified in various ways.

In the drawings, to clearly and briefly explain the embodiments of the present invention, illustration of elements that do not aid in the understanding of the disclosure may be omitted, and the same or extremely similar elements may be designated by the same reference numerals throughout the specification. In addition, in the drawings, for more clear explanation, the dimensions of elements, such as thickness, width, and the like, may be exaggerated or reduced, and thus the thickness, width, and the like of the present invention are not limited to the illustration of the drawings.

In the entire specification, when an element is referred to as "including" another element, the element should not be understood as excluding other elements so long as there is no conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a display apparatus in accordance with an embodiment of the present invention will be described in detail with reference to the accompanying drawings.

Figure 1:
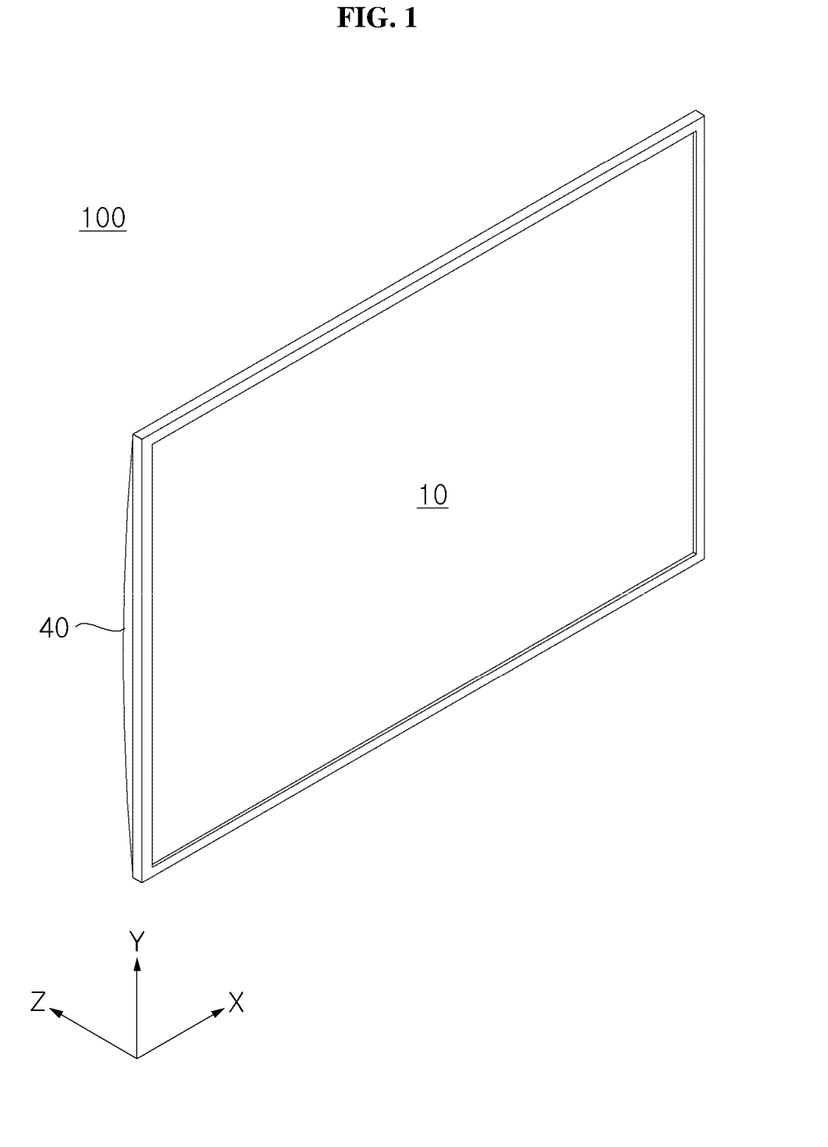
FIG. 1 is a front perspective view of a display apparatus in accordance with an embodiment of the present invention.
Figure 2:
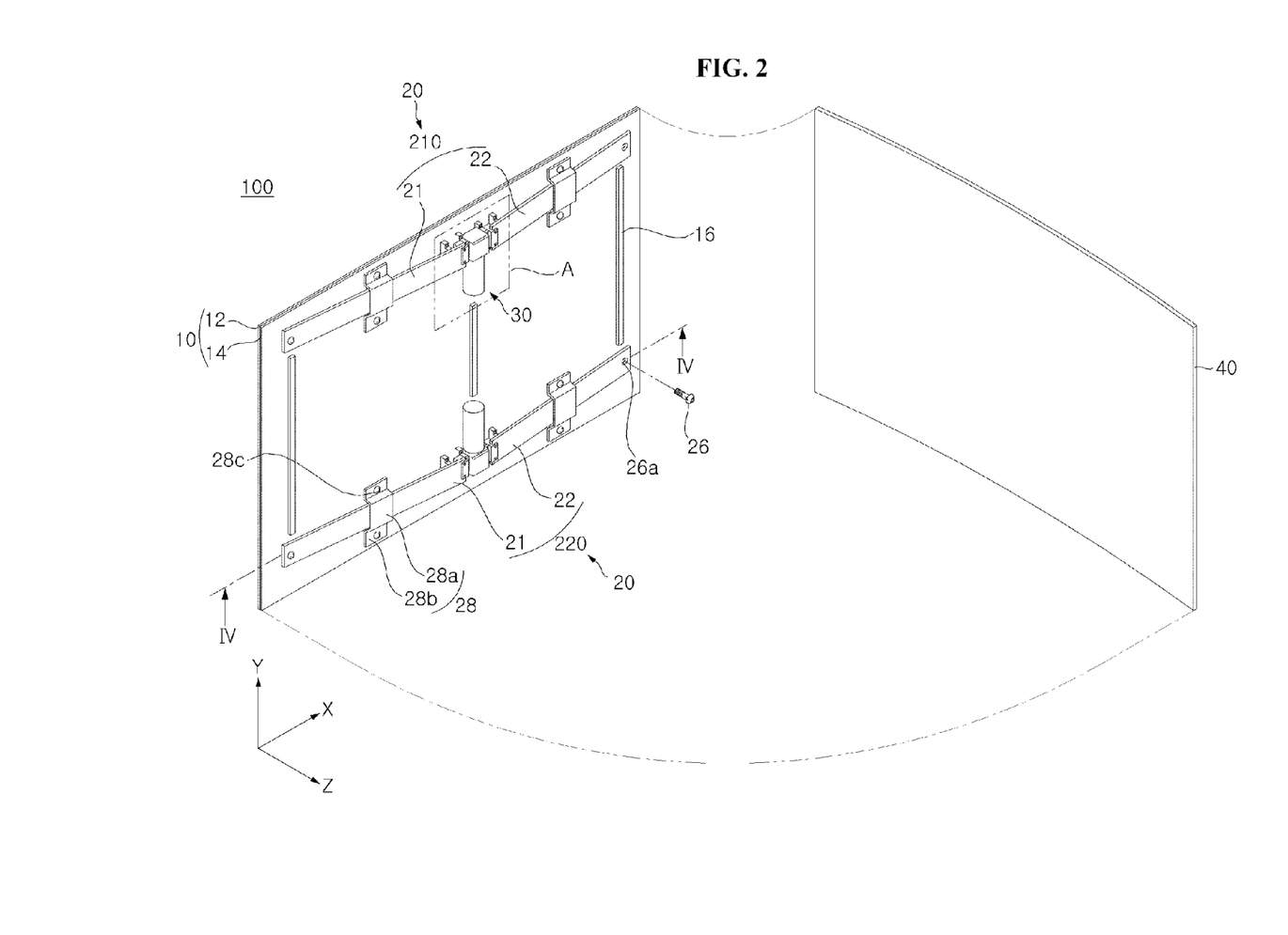
FIG. 2 is a rear exploded perspective view of the display apparatus shown in FIG. 1.
Figure 3:
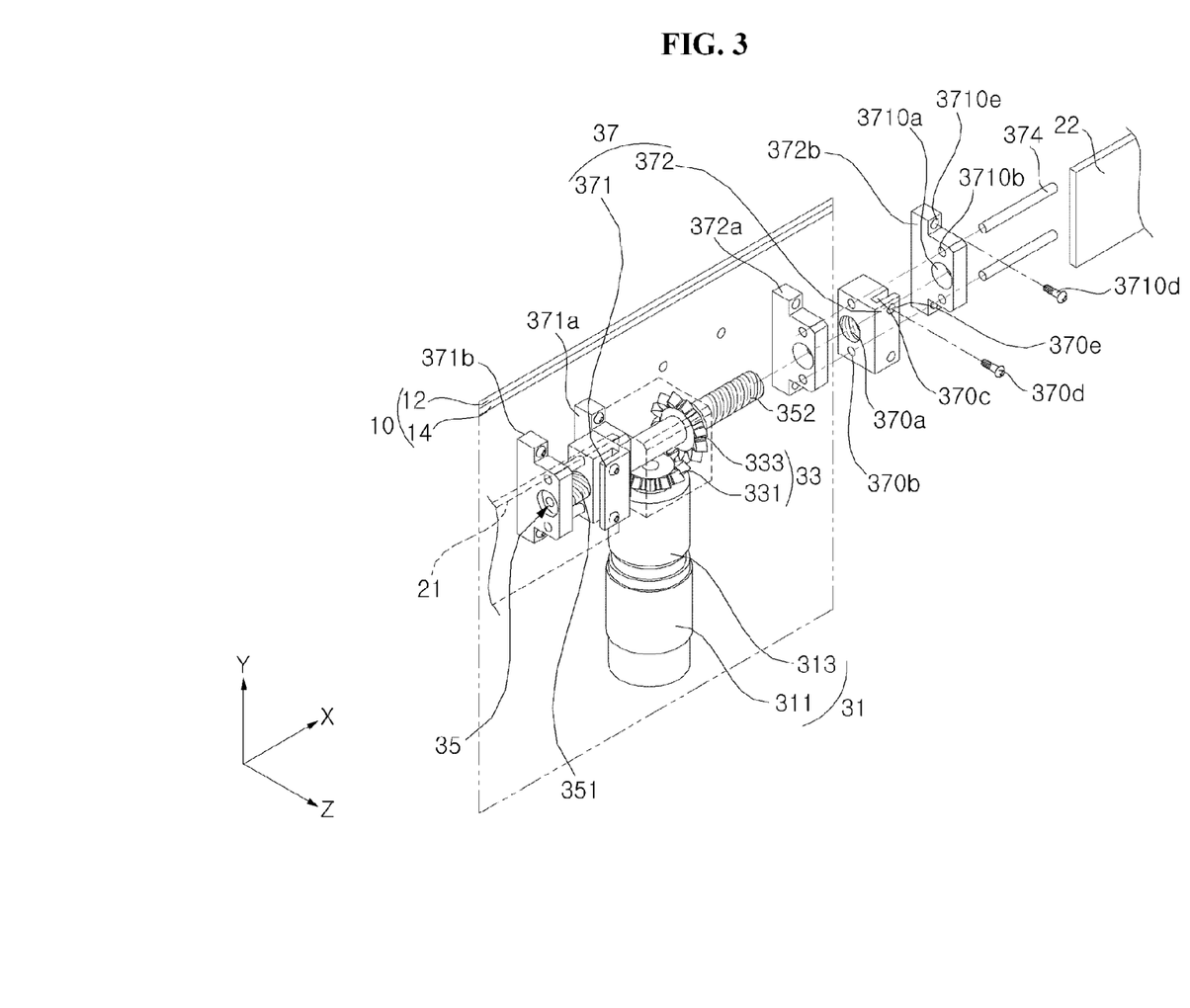
FIG. 3 is an enlarged-scale exploded perspective view of portion A of FIG. 2.

FIG. 1 is a front perspective view of a display apparatus in accordance with an embodiment of the present invention, and FIG. 2 is a rear exploded perspective view of the display apparatus shown in FIG. 1. Also, FIG. 3 is an enlarged exploded perspective view of portion A of FIG. 2.

Referring to the drawings, the display apparatus, designated by reference numeral 100, in accordance with the embodiment of the present invention, includes a display module 10 including a display panel 12 to display an image, a variable member 20 to vary the shape of the display panel (or the display module 10), and a drive unit 30 to provide the variable member 20 with energy required to vary the shape of the display panel 12. In addition, the display apparatus 100 further includes a rear cover 40 configured to cover a rear surface of the display module 10. This will be described later in more detail.

The display apparatus 100 is used in a generic sense to refer to an apparatus in which images, data, and the like are visible on a screen, and may be any one of various kinds of display apparatuses, such as a television, a computer monitor, a mobile phone, an e-book, and the like.

The display module 10 may include the display panel to display an image in practice, a support member 14 disposed at a rear surface of the display panel 12 to support the display panel 12, and a panel drive unit (not shown) secured to the support member 14, the panel drive unit providing a signal for driving the display panel 12.

In the present embodiment, the display panel 12 may have various configurations and designs to display an image. The display panel 12 may be flexible, the shape of which is variable by the variable member 20.

For instance, the display panel 12 may be an organic light emitting display panel using Organic Light Emitting Diodes (OLEDs). The organic light emitting display panel is a self-emissive display panel in which light is generated using electron-hole bonding in a fluorescent or phosphate organic thin film as current flows through the organic thin film. Organic light emitting display panels have several advantages, including provision of bright and vivid images, no limitations due to a viewing angle, low power consumption, and the like. In particular, the organic light emitting display panel may be fabricated via organic thin film lamination, thus exhibiting excellent flexibility. However, the present invention is not limited thereto and various display panels having various configurations and designs may be employed. For instance, a liquid crystal display (LCD) panel could be used.

The support member 14 is disposed at the rear surface of the display panel 12 to support the display panel 12. The panel drive unit to drive the display panel 12 and the variable member 20 may be disposed at a rear surface of the support member 14, the panel drive unit being secured to the rear surface of the support member 14. As such, the support member 14 may be configured to exhibit not only a sufficient strength to firmly support and secure the display panel 12, the panel drive unit, and the variable member 20, but also flexibility and elasticity to be variable in shape when the shape of the display panel 12 is varied. In addition, to prevent thermal stress, and the like, the support member 14 may have a thermal expansion coefficient analogous to that of the display panel 12.

For instance, in the present embodiment, the support member 14 may be formed of a composite material, such as reinforced resin, and the like. Here, a composite material refers to a material in which two or more kinds of materials are artificially bonded to each other to achieve enhanced characteristics. Exemplary composite materials include reinforced resins, such as Carbon Fiber Reinforced Plastics (CFRPs), Glass Fiber Reinforced Plastics (GFRPs), and the like. Hence, the support member 14 may be lightweight and flexible, which are inherent features of plastics, and may achieve high strength and elasticity as well as excellent wear resistance owing to various fibrous reinforcements. The support member 14 may take the form of a single composite material layer, or may be a stack of multiple composite material layers for the purpose of high strength.

The support member 14 may be secured to the rear surface of the display panel 12 using an adhesive (e.g., a double-sided tape), and the like. As such, the entire support member 14 may be secured to the rear surface of the display panel 12 by coming into close contact with the rear surface of the display panel 12, which may allow the support member 14 to be transformed into the same shape as that of the display panel 12 as the display panel 12 is transformed. More specifically, the display panel 12 and the support member 14, which are integrated with each other, may be transformed into the same shape or similar shapes corresponding to each other by force or energy transmitted via the variable member 20. However, the present invention is not limited thereto and various other methods may be employed to couple the display panel 12 and the support member 14 to each other.

The panel drive unit, secured to the rear surface of the support member 14, includes a circuit board (not shown) provided with different wirings, devices, and the like, which provide signals required to drive the display panel 12. The circuit board may be secured to the support member using a bracket (not shown), and the like. For instance, the bracket may be coupled, only at a central portion thereof, to the support member 14, which may minimize force required to vary the shape of the display panel 12. However, the present invention is not limited thereto, and various alterations, such as, for example, an alteration in which the panel drive unit is partially or wholly located at the outside of the display module 10, are possible. In addition, the panel drive unit of the present embodiment may include the drive unit 30 to drive the variable member 20.

Although not additionally shown in the drawings, a framework configured to surround edges of the display panel 12 and the support member 14 may be further provided. The framework may serve not only to protect and enhance the strength of an edge of the display module 10, but also to assist the rear cover 40 in being stably seated on the display module 10. The shape of the framework, a coupling configuration of the framework and the rear cover 40, and the like may be accomplished through various configurations and methods.

The display module 10 (more particularly, the support member 14) may be provided at the rear surface thereof with a reinforcement member 16. The reinforcement member 16 extends in a first direction (in a vertical direction of the display panel 12 or the display module 10, or in the y-axis of the drawing) to reinforce the support member 14.

As the reinforcement member 16 extends in the first direction of the support member 14, the reinforcement member 16 may allow the display module 10 to be flat without a curvature (more particularly, a vertical curvature) in a cross section (in the yz plane of the drawing) perpendicular to a second direction, the second direction crossing the first direction and, for instance, being a horizontal direction of the display panel 12 or the display module 10 or corresponding to the x-axis of the drawing. The reinforcement member 16 may be formed of one or more various materials to enhance the strength of the support member 14, and may be secured to the support member 14 using various configurations and methods.

In the present embodiment, the display panel 12 may achieve enhanced structural stability owing to the reinforcement member 16 serving to minimize a vertical curvature. However, the present invention is not limited thereto, and the display panel 12 may have a vertical curvature to further enhance immersiveness.

The display module 10 (more particularly, the support member 14) may be provided at the rear surface thereof with the variable member 20 to vary the shape of the display panel 12. In the present embodiment, the variable member 20 may include a first part 21 and a second part 22, and may generally be elongated in a horizontal direction of the display module 10. Although the drawings and the description illustrate the variable member 20 as including the first and second parts 21 and 22, the present invention is not limited thereto. For example, the variable member 20 may include three or more parts. In this case, the following description of the first and second parts 21 and 22 may be applied to two neighboring parts among the three or more parts.

The first and second parts 21 and 22 may each take the form of an elongated band having a constant width. This form may assist the first and second parts 21 and 22 in more efficiently applying force to the display module 10. However, the present invention is not limited thereto and the first and second parts 21 and 22 may have various other shapes. The first and second parts 21 and 22 may be formed of a material that is variable in shape when the shape of the display panel 12 is varied to thereby apply force to the display module 10. Accordingly, the first and second parts 21 and 22 may include a single layer or multiple layers formed of a composite material, such as reinforced resins (CFRP, GFRP, and the like). However, the present invention is not limited thereto and the first and second parts 21 and 22 may be formed of various other materials.

A distance between the variable member 20 and the display module 10 may be greater at the center of the display module 10 than at the edge of the display module 10. For instance, a central portion of the variable member 20 may slightly protrude rearward from the display module 10. In this case, the first and second parts 21 and 22 of the variable member 20 may have a flat shape, and may have a central portion slightly protruding rearward than a remaining portion thereof so as to be tilted to the display module 10 (see, for example, FIG. 4(a)). Hence, when trying to transform the display module 10 into a curved state, variation in the shape of the variable member 20 may facilitate easier transformation of the display module 10.

In the present embodiment, the variable member 20 includes only the band-shaped first and second parts 21 and 22, and the drive unit 30 varies the shape of the variable member 20 by adjusting a distance between the first part 21 and the second part 22. As such, the variable member 20 may have a simplified configuration and variation in the shape of the variable member 20 may be effectively controlled by the drive unit 30. This will be described in greater detail later.

Ends of the first and second parts 21 and 22 may be secured to the drive unit 30, or may be connected directly to the drive unit 30 so as to come into contact with and to be linked to the drive unit 30. Alternatively, ends of the first and second parts 21 and 22 may be secured to the support member 14. The present embodiment illustrates that outer ends of the first and second parts 21 and 22, which are proximate to the edge of the display module 10, are secured to the support member 14, and inner ends of the first and second parts 21 and 22 (i.e., facing ends of the first part 21 and the second part 22) are connected to the drive unit 30.

More specifically, ends of the first and second parts 21 and 22, which are proximate to the edge of the display module 10, are secured to the support member 14 via fastening members 26. For instance, a PEM nut (not shown) may be located at the support member 14, and the fastening member 26, such as a screw, bolt, and the like, may be fastened through the PEM nut and a fastening hole 26a perforated in the end of the first part 21 or the second part 22, whereby the end of the first part 21 or the second part 22 may be secured to the support member 14. As such, simplified and easy fastening is possible when using the PEM nut, screw, bolt, and the like. However, the present invention is not limited thereto and various other configurations and methods may be employed to secure the ends of the first and second parts 21 and 22 to the support member 14.

A connection configuration of the inner ends of the first and second parts 21 and 22 and the drive unit 30 may be changed according to, e.g., a configuration of the drive unit 30. Thus, a connection configuration of the inner ends of the first and second parts 21 and 22 and the drive unit 30 will be described later in detail after explanation of the drive unit 30.

The first and second parts 21 and 22 may be movably supported by guide members 28 that are secured to the support member 14. This may prevent deformation of the first and second parts 21 and 22, such as sagging, for example, and allow the first and second parts 21 and 22 to be movable relative to the support member 14.

Each of the guide members 28 includes an upper portion 28a, which is spaced apart from the support member 14 with a predetermined space therebetween, and a pair of lateral portions 28b downwardly bent from the upper portion 28a so as to come into contact with the support member 14. The lateral portions 28b are secured to the support member 14 via fastening members 28c. For instance, PEM nuts (not shown) may be located at the support member 14, and the fastening members 28c, such as screws, and the like, may be fastened through the PEM nuts and fastening holes of the lateral portions 28b to secure the guide member 28 to the support member 14. As such, simplified and easy fastening is possible when using the PEM nuts and screws. However, the present invention is not limited thereto and various other configurations and methods may be employed to secure the guide member 28 to the support member 14.

The guide members 28 prevent unnecessary or unintentional transformation of the variable member 20 (i.e., the first and second parts 21 and 22), which may allow the display panel 12 (or the display module 10) to be better controlled and uniformly transformed according to transformation of the variable member 20.

More specifically, when the drive unit 30 pushes the first part 21 and the second part 22 away from each other under the absence of the guide members 28, the first part 21 may be rearwardly convexly transformed between the inner end of the first part 21 (i.e., the end proximate to the center of the display panel 12) and the outer end of the first part 21 (i.e., the end proximate to the edge of the display panel 12), thus exerting only a small force to push the display panel 12 forward. Similarly, the second part 22 may be rearwardly convexly transformed between the inner end of the second part 22 and the outer end of the second part 22, thus exerting only a small force to push the display panel 12 forward. In addition, since the variable member 20 is secured to the display module 10 only at three positions (the outer end of the first part 21, the outer end of the second part 22, and a position where the first part 21 and the second part 22 are connected to the support member 14 via the drive unit 30), uniform transformation of the display panel 12 is difficult.

On the other hand, in the present embodiment, the guide members 28 serve not only to prevent the first part or the second part 22 from being rearwardly convexly transformed, but also provides for pushing the first and second parts 21 and 22 forward. Therefore, transformation acquired by an increase in a distance between the first part 21 and the second part 22 may wholly serve as a force to push the display panel 12 forward. In addition, since the variable member 20 is secured to the display module 10 at five positions at least (the outer end of the first part 21, the outer end of the second part 22, a position where the first part 21 and the second part 22 are connected to the support member 14 via the drive unit 30, the guide member 28 to movably secure the first part 21, and the guide member 28 to movably secure the second part 22), the display panel 12 may be transformed more uniformly by a greater degree.

As described above, a distance between the variable member 20 and the display module 10 is increased going from the outer end of the first part 21 and the second part 22 toward the center. Therefore, a height of the lateral portion 28b of each guide member 28 may increase going from the outer end of the first part 21 and the second part 22 toward the center. This configuration ensures that the first and second parts 21 and 22 are freely movable leftward or rightward while being effectively supported by the respective guide members 28.

The drawing illustrates that two guide members 28 are allotted respectively to the first and second parts 21 and 22. Here, the number of the guide members 28 is reduced, which results in reduced manufacturing cost and a simplified manufacturing process. However, the present invention is not limited thereto. Thus, two or more guide members 28 may be provided at each of the first and second parts 21 and 22. In this case, providing each of the first and second parts 21 and 22 with a plurality of guide members 28 may effectively prevent, for example, sagging of the first and second parts 21 and 22.

In the present embodiment, the shape of the entire variable member 20 may vary in response to variation in a distance between the first part 21 and the second part 22.

For instance, when a distance between the first part and the second part 22 is increased, a length of the entire variable member 20 (i.e., the sum of a length of the first part 21, a length of the second part 22, and the distance between the first part 21 and the second part 22) is increased, which causes an increase in the curvature of the variable member 20. Thereby, as both ends of the display panel 12, to which both ends of the variable member 20 are secured, are pushed to protrude forward, the display panel 12 is transformed into a curved state. In this way, at least a portion of the display panel 12 may be bent by a given curvature. This may result in enhanced immersiveness of the user. The curvatures at different positions of the display panel 12 (or the display module 10) in a curved state thereof will be described in more detail later.

On the other hand, when a distance between the first part 21 and the second part 22 is reduced, a length of the entire variable member 20 is reduced. Thereby, the display panel 12 returns to a planar shape. Accordingly, the display panel 12 may remain in a planar state when immersiveness is not required (for example, when watching the news).

The drive unit 30, which serves to vary a distance between the first part 21 and the second part 22, includes a rotation drive member 31 to supply rotational energy, a lead screw member 35 having screw-threads 351 and 352 to change the rotational energy into linear movement energy, and a moving member 37 configured to linearly move on the lead screw member 35. In the present embodiment, the drive unit 30 may further include a gear member 33 to change a rotating axis of rotational energy of the rotation drive member 31.

The rotation drive member 31 to supply rotational energy may be a drive member fabricated in various configurations and via various methods. For instance, the rotation drive member 31 may include a motor 311, and may further include a speed reducer 313 that reduces a rate of rotation of the motor 311 to supply increased rotational energy. Provision of the speed reducer 313 may result in a significant reduction in the size of the motor 311. In this case, a speed reduction ratio of the speed reducer 313 may be within a range of 1:2 to 1:300. This range is determined to provide the mechanical energy required to vary the shape of the variable member 20 while minimizing the size of the motor 311. However, the speed reduction ratio of the speed reducer 313 may be changed according to the kind of the motor 311, the configuration of the drive unit 30, and the like. In an alternative embodiment, the speed reduction ratio of the speed reducer 313 may be 1:1.

The gear member 33 changes the direction of a rotating axis of the rotation drive member 31. For instance, a rotating axis of the rotation drive member 31 is parallel to the display module 10 and intersects with a longitudinal direction of the variable member 20. The gear member 33 changes the direction of the rotating axis to a direction parallel to a longitudinal direction of the variable member 20. In the present embodiment, the gear member 33 may have a bevel gear configuration. That is, the gear member 33 may include conical first and second gear members 331 and 333 to change the direction of the rotating axis of the rotation drive member 31. In this case, the gear member 33 may be any one selected from among a linear bevel gear, a curvilinear bevel gear, a Zerol bevel gear, and the like. When using the gear member 33 in the form of a bevel gear, the gear member 33 may be easily driven even by low power and exhibit high durability. In addition, a thickness of the display apparatus 100 may be minimized owing to the minimized volume of the gear member 33.

The lead screw member 35 may be secured to the gear member 33 and be located in a direction parallel to a longitudinal direction of the variable member 20. The lead screw member 35 includes screw-threads 351 and 352 of a left-hand screw type and/or right-hand screw type. In the present embodiment, the first screw-threads 351 are formed at a first portion of the lead screw member 35 proximate to the first part 21, and the second screw-threads 352 are formed at a second portion of the lead screw member 35 proximate to the second part 22. The first screw-threads 351 and the second screw-threads 352 may have opposite screwing directions. That is, assuming that the first screw-threads 351 are of a right-hand screw type, the second screw-threads 352 are of a left-hand screw type. Assuming that the first screw-threads 351 are of a left-hand screw type, the second screw-threads 352 are of a right-hand screw type.

The moving member 37 includes a first moving member 371 configured to move on the first screw-threads 351, the first moving member 371 being connected to the first part 21, and a second moving member 372 configured to move on the second screw-threads 352, the second moving member 372 being connected to the second part 22.

Each of the first and second moving members 371 and 372 has a nut hole 370a to be engaged at an inner circumferential surface thereof with the first or second screw-threads 351 or 352. As such, the nut hole 370a of the first moving member 371 is located at the first screw-threads 351 of the lead screw member 35, and the nut hole 370a of the second moving member 372 is located at the second screw-threads 352 of the lead screw member 35. With this configuration, when the lead screw member 35 is rotated, the first and second moving members 371 and 372 engaged with the first and second screw-threads 351 and 352 are linearly moved. As described above, since the first screw-threads 351 and the second screw-threads 352 have opposite screwing directions, the first moving member 371 and the second moving member 372 may be moved toward or away from each other when the rotation drive member 31 is rotated in a given direction. In addition, the first and second moving members 371 and 372 may each have guide through-holes 370b at both sides of the nut hole 370a, such that guide members 374 may be inserted into the guide through-holes 370b to ensure stable movement of the first or second moving member 371 or 372.

In addition, the first and second moving members 371 and 372 may further have grooves 370c, respectively, into which the first and second parts 21 and 22 are fitted. As such, the first part 21 may be coupled to the first moving member 371, and the second part 22 may be coupled to the second moving member 372. In a state in which the first part 21 is fitted into the first moving member 371, the first part 21 and the first moving member 371 are secured to each other via first fastening members 370d. In a state in which the second part 22 is fitted into the second moving member 372, the second part 22 and the second moving member 372 are secured to each other via second fastening members 370d. For instance, the first moving member 371 and the first part 21 are secured to each other with the first fastening members 370d, such as screws, bolts, and the like, which are fastened through fastening holes 370e formed in the first moving member 371 and the first part 21. In addition, the second moving member 372 and the second part 22 are secured to each other with the second fastening members 370d, such as screws, bolts, and the like, which are fastened through fastening holes 370e formed in the second moving member 372 and the second part 22. Through use of the first or second fastening members 370d, such as bolts, screws, and the like, the first and second moving members 371 and 372 may be firmly secured to the first and second parts 21 and 22 in a simplified configuration.

The first moving member 371 is provided at one side thereof with a first bracket 371a and at the other side thereof with a second bracket 371b. Specifically, the first bracket 371a is located at one end of the first portion of the lead screw member 35 (i.e., at the center portion of the lead screw member 35), and the second bracket 371b is located at the end of the first portion of the lead screw member 35 (i.e., at one end of the lead screw member 35). Similarly, the second moving member 372 is provided at one side thereof with a first bracket 372a and at the other side thereof with a second bracket 372b. Specifically, the first bracket 372a is located at one end of the second portion of the lead screw member 35 (i.e., at the center portion of the lead screw member 35), and the second bracket 372b is located at the other end of the second portion of the lead screw member 35 (i.e., at the other end of the lead screw member 35).

In this case, the first brackets 371a and 372a serve not only as bearing members to prevent eccentric rotation of the rotation drive member 31, but also as coupling members to connect the lead screw member 35 and the rotation drive shaft 31 to each other. The first brackets 371a and 372a may each have a nut hole 3710a, through which the lead screw member 35 passes, and guide through-holes 3170b through which the guide members 374 are inserted. The second brackets 371b and 372b may each have a screw fixing hole 3710a, through which the lead screw member 35 is inserted, and guide through-holes 3170b through which the guide members 374 are inserted. The first brackets 371a and 372a and the second brackets 371b and 372b may be secured to the support member 14 via various configurations and methods. For instance, PEM nuts may be located at the support member 14, and fastening members 3710d may be fastened through the PEM nuts and fastening holes 3710e of the first brackets 371a and 372a and the second brackets 371b and 372b.

However, the present invention is not limited to the above described configurations of the variable member 20 and the drive unit 30, and the variable member 20 and the drive unit 30 may have various other configurations and designs to enable transform of the display panel 12 (or the display module 10).

The drawing illustrates that the variable member 20 includes a first variable member 210 located at an upper portion of the display module 10 and a second variable member 220 located at a lower portion of the display module 10. Usually, upper and lower edge portions of the display module 10 are less transformable when only one variable member 20 is located at a center region of the display module 10. Through provision of a plurality of variable members 20, the entire display module 10 may be uniformly transformed. In this case, as a result of locating the first and second variable members 210 and 220 at positions proximate to an upper edge and a lower edge of the display module 10 respectively, easier transformation even at the edges which have difficulty in being transformed may be possible. In addition, as a result of providing a sufficient space between the first variable member 210 and the second variable member 220 to position the panel drive unit in that space, the volume occupied by the panel unit at the display apparatus 100 may be minimized.

However, the present invention is not limited thereto and only one variable member 20 may be provided in terms of cost saving and configuration simplification. Alternatively, in consideration of use of a large-area display module, for example, three or more variable members may be provided. Various other alterations are possible.

The rear cover 40 is disposed at the rear surface of the display module 10 and the variable member 20. The rear cover 40 serves not only to provide a space that will be occupied by some components, such as, for example, the panel drive unit, but also to protect the display module 10 as well as the panel drive unit from external shock. In addition, the rear cover 40 is configured to cover the panel drive unit, and the like, thereby preventing internal components from being visible from the outside, and consequently enhancing the aesthetics of the display module 10. For instance, the rear cover 40 generally has a curvilinear profile, which may provide a sufficient inner space as well as improved external appearance.

In the present embodiment, the rear cover 40 is configured to conform to variation in the shape of the display module 10 when the shape of the display module 10 is varied. Thus, the rear cover 40 may protect the display module 10 and assist the display module 10 in maintaining the external appearance thereof even after the shape of the display module 10 is varied, rather than hindering variation in the shape of the display module 10.

Figure 4A:
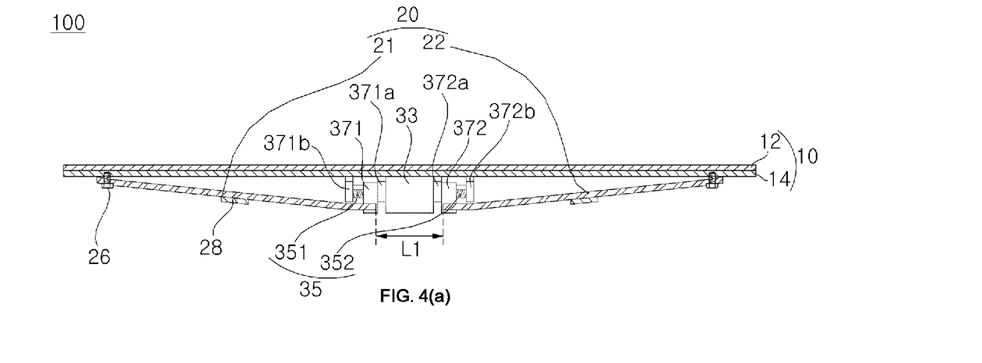
FIG. 4(a) and FIG. 4(b) are sectional views taken along line IV-IV of FIG. 2 for explanation of variation in the shape of the display apparatus shown in FIGS. 1 to 3.
Figure 4B:
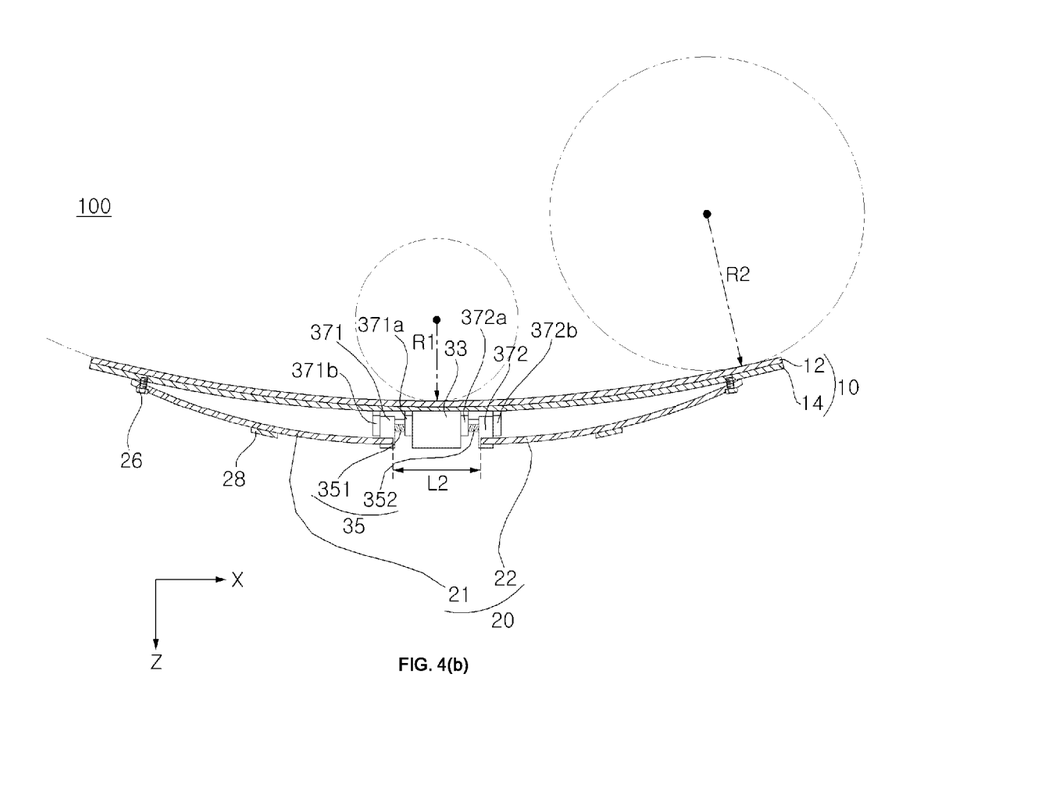

Variation in the shape of the display apparatus 100 as described above will now be described in greater detail with reference to FIGS. 4(a) and 4(b). FIGS. 4(a) and 4(b) are sectional views taken along line IV-IV of FIG. 2, for explanation of variation in the shape of the display apparatus 100 shown in FIGS. 1 to 3.

Referring to FIG. 4(a), in a first planar state, the first and second moving members 371 and 372 are located proximate to the first brackets 371a and 372a, respectively. Hence, the first part 21 and the second part 22 are spaced apart from each other by a relatively small first distance L1. In this case, the first and second parts 21 and 22 of the variable member 20 are relatively flat and are tilted to the display panel 10. With this configuration, even when the variable member 20 is transformed several times, it is possible to minimize bending or transformation of the variable member 20. In this state, the display panel 12 (or the display module 10) may be kept in the first planar state.

When the user inputs an instruction for transformation into a second curved state, the rotation drive member 31 is rotated in a first rotating direction and the gear member 33 changes a rotating axis of the rotation drive member 31 into a direction parallel to a longitudinal direction of the variable member 20, thus causing the lead screw member 35 to be rotated in a first direction. Thereby, the first moving member 371 and the second moving member 372 are moved away from each other, and the first part 21 secured to the first moving member 371 and the second part 22 secured to the second moving member 372 are moved away from each other. In this case, once the first and second moving members 371 and 372 have reached the second brackets 371b and 372b, the first and second moving members 371 and 372 are fixed at corresponding positions. In this way, the first part 21 and the second part 22 are fixed with a relatively large second distance L2 therebetween. Consequently, as exemplarily shown in FIG. 4(b), a length of the entire variable member 20, i.e., the sum of a length of the first part 21, a length of the second part 22, and the second distance L2, is increased, thus causing the variable member 20 to be bent by a given curvature. More specifically, the variable member 20 is bent by a given curvature (hereinafter "horizontal curvature") in a plane (in a cross section parallel to the floor when the display panel 12 is upright on the floor, i.e., in the xz plane of the drawing) perpendicular to the first direction (the vertical direction of the display panel 12, i.e., in the y-axis of the drawing). In this way, the display panel 12 is transformed into the second curved state with a given curvature.

When the user inputs an instruction for transformation into the first planar state, the rotation drive member 31 is rotated in a second rotating direction opposite to the first rotating direction, and consequently the lead screw member 35 is rotated in a second direction opposite to the first direction. Thereby, the first moving member 371 and the second moving member 372 are moved toward each other, and the first part 21 secured to the first moving member 371 and the second part 22 secured to the second moving member 372 are moved toward each other. In this case, once the first and second moving members 371 and 372 have reached the first brackets 371a and 372a, the first and second moving members 371 and 372 are fixed at corresponding positions. Correspondingly, the first part and the second part 22 are fixed with the relatively small first distance L1 therebetween. As a result, a length of the entire variable member 20, i.e., the sum of a length of the first part 21, a length of the second part 22, and the first distance L1, is reduced, thus causing the display panel 12 to return to the first planar state.

In the above description, the user may instruct and control variation in the shape of the display panel 12 in a variety of ways. For instance, the user may input an instruction for variation in the shape by pushing a button of the display apparatus 100, by operating a device to control the display apparatus 100 at a remote distance (e.g., a remote controller), or by taking a certain action (e.g., movement of the user's pupils, or via clapping).

In the present embodiment, variation in the shape of the entire variable member 20 is accomplished via adjustment of a distance between the first part 21 and the second part 22, rather than direct transformation of the first part 21 and the second part 22 (e.g., using shape-memory alloy). This may minimize unwanted permanent deformation of the first and second parts 21 and 22, despite repeated movements thereof. However, in an alternative embodiment, a shape-memory alloy may be used. In addition, as the first and second parts 21 and 22 are directly connected to the first and second moving members 371 and 372, the variable member 20 may be easily transformed by a small force. In addition, in both cases of transformation into a curved state and of return to a planar state, the first and second moving members 371 and 372 apply a force to the first and second parts 21 and 22 so as to pull on the first and second parts 21 and 22. This may ensure stable implementation of return to the planar state.

In this case, variation in the distance between the first part 21 and the second part 22 is accomplished via change from rotational energy of the drive unit 30 into movement energy of the moving member 37. As such, the distance between the first part 21 and the second part 22 may be varied with a minimized friction area and consequently minimized contact loss. In addition, a transformation degree of the variable member 20 may be precisely controlled by controlling the rotation of the rotation drive member 31 of the drive unit 30.

That is, stable transform may be accomplished with minimized energy required to vary the shape of the display apparatus 100.

Although the above description is centered on transformation into the first planar state and the second curved state, the present invention is not limited thereto. Thus, for instance, the display panel 12 may be transformed from a first curved state having a relatively small curvature to a second curved state having a relatively great curvature. Alternatively, the display panel 12 may be transformed with different curvatures. In addition, the display panel 12 may be transformed into various other shapes.

In the above described display apparatus 100, the shape of the display panel 12 (or the display module 10) is varied into the first or second state by the above described variable member 20. In the present embodiment, in the second state, at least two portions of the variable member 20 and/or the display panel 12 may have different curvatures. This will be described later in detail with reference to FIGS. 4(a), 4(b), and 5.

Figure 5:
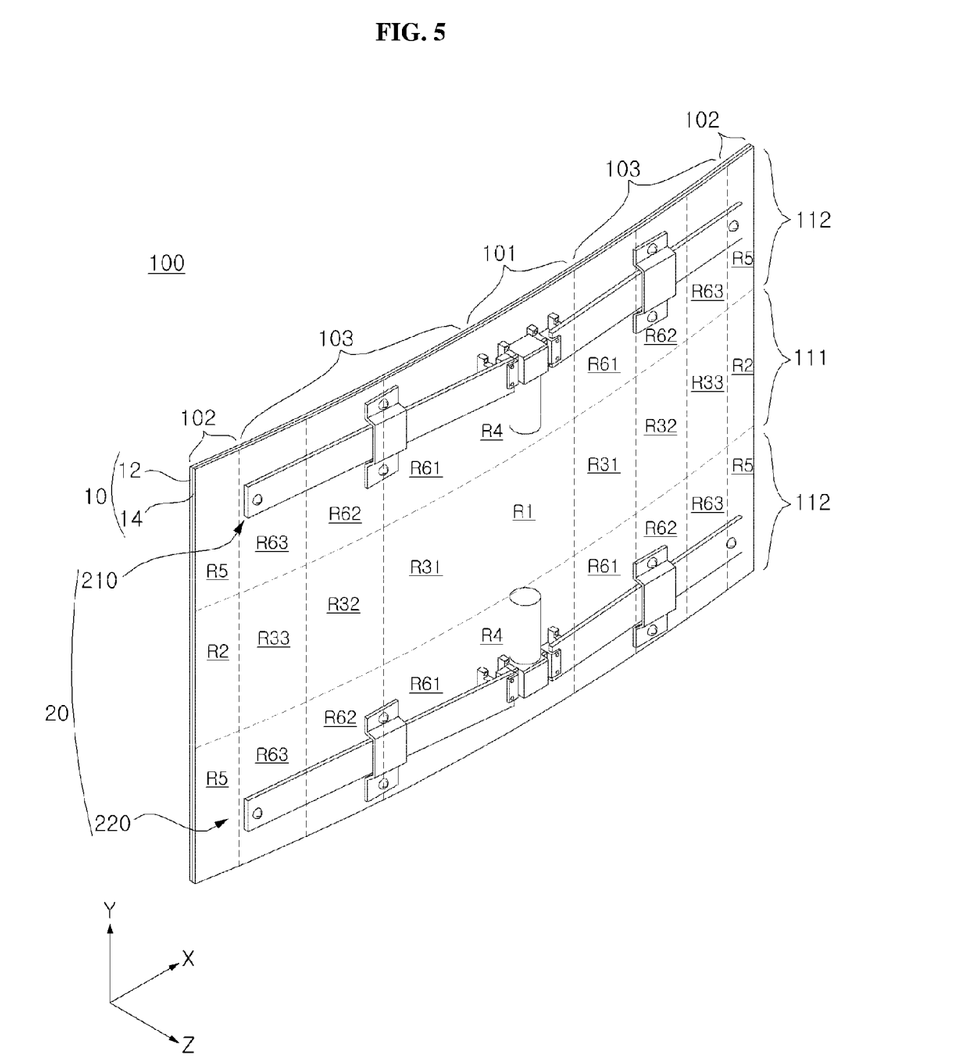
FIG. 5 is a view explaining a horizontal curvature (or a radius of horizontal curvature) when a display panel and a variable member of the display apparatus shown in FIG. 1 are in a second state.

FIG. 5 is a view explaining a horizontal curvature (or a radius of horizontal curvature) when the display panel 12 and the variable member 20 of the display apparatus 100 shown in FIG. 1 are in the second state.

Referring to FIGS. 4(a), 4(b), and 5, in the second state, the display panel 12 may be bent such that at least two portions of the display panel 12 have different curvatures (for example, different horizontal curvatures in the present embodiment). For reference, as described above, the horizontal curvature refers to a curvature of the display panel 12 when the display panel 12 is forwardly convexly bent in a cross section (in the xz cross section of the drawing) perpendicular to the first direction (the vertical direction of the display panel 12, i.e., in the y-axis direction of the drawing).

In the present embodiment, in the second state, an edge portion of the display panel 12 may have a less horizontal curvature than that at a center portion of the display panel 12 in the second direction (in the horizontal direction of the display panel 12, i.e., in the x-axis of the drawing) crossing (e.g., perpendicular to) the first direction. As such, in the second state, the edge portion of the display panel 12 may have a greater radius of horizontal curvature than that at the center portion of the display panel 12 in terms of the second direction. Here, the radius of horizontal curvature may be defined as a radius of curvature due to horizontal curvature. Providing different portions of the display panel 12 with different horizontal curvatures may be accomplished using the drive unit 30 located at the center portion of the display panel 12 that functions with the first and second parts 31 and 32 to transform the first and second parts 31 and 32 of the variable member 20.

The center portion of the display panel 12 is bent by a relatively great horizontal curvature (i.e., bent more greatly) in terms of the second direction, which may effectively enhance immersiveness of the user. In addition, the edge portion of the display panel 12 is bent by a relatively small horizontal curvature or is flat with no horizontal curvature, which may allow even the user who does not face the center portion of the display panel 12 to stably view the display panel 12. That is, although bending of the display panel 12 may enhance immersiveness in a case in which the user faces the center portion of the display panel 12, the edge portion of the display panel 12 may hide the user's view or deteriorate the user's view when the user deviates from the center portion of the display panel 12 and the edge portion of the display panel has a relatively great horizontal curvature. With regard to this point, in the present embodiment, the edge portion of the display panel 12 may have a relatively small horizontal curvature to enable stable watching by the user. In this way, in the present embodiment, the center portion of the display panel 12 may have a relatively great horizontal curvature and the edge portion of the display panel 12 may have a relatively small horizontal curvature or no horizontal curvature, which may result in enhanced immersiveness and stable watching by the user.

In addition, the horizontal curvature of the display panel 12 in the second state may be gradually reduced with increasing distance from the center portion or decreasing distance to the edge portion of the display panel 12. Hence, even if the center portion and the edge portion of the display panel 12 in the second state have different horizontal curvatures (or different radii of horizontal curvature) in terms of a vertical direction, it is possible to prevent the viewer from sensing a difference of the horizontal curvatures or suffering from inconvenience in watching.

In addition, in the present embodiment, in the second state, the edge portion of the display panel 12 may have a horizontal curvature equal to or greater than that at the center portion of the display panel 12 in terms of the first direction (in the vertical direction of the display panel 12, i.e., in the y-axis direction of the drawing). As such, in the second state, a radius of horizontal curvature of the edge portion of the display panel 12 may be equal to or less than a radius of horizontal curvature of the center portion of the display panel 12 in terms of the first direction.

This is possible by the variable member 20, configured to vary the shape or the state of the display panel 12, includes the first variable member 210 located at the upper portion of the display panel 12 and the second variable member 220 located at the lower portion of the display panel 12. In a case in which the variable member 20 includes the first and second variable members 210 and 220, it is possible to stably induce variation in the shape of the display panel 12 at the upper edge or the lower edge thereof which have difficulty in being transformed, and to allow the panel drive unit to be located in a space between the first and second variable members 210 and 220. In addition, it is unnecessary to provide an additional variable member 20 at the center portion of the display panel 12 in the first direction, which may reduce cost due to installation of the variable member 20. In this way, for providing the difference of horizontal curvatures (or radii of horizontal curvature) in the first direction of the display panel 12, as described above, the variable member 20 is located at an appropriate position to achieve various effects.

In addition, although a horizontal position of the user relative to the display panel 12 may vary greatly, generally, variation in a vertical position of the user relative to the display panel 12 is not great. Accordingly, even when the edge portion of the display panel 12 has a great curvature in terms of the first direction, this does not hinder watching by the user. By increasing the horizontal curvature (or reducing the radius of horizontal curvature) of the edge portion of the display panel 12 in terms of the first direction may further enhance immersiveness of the user without hindering stable watching by the user.

In addition, the horizontal curvature of the display panel 12 in the second state may be gradually increased with increasing distance from the center portion or decreasing distance to the edge portion of the display panel 12. Hence, even if horizontal curvatures (or radii of horizontal curvature) of the center portion and the edge portion of the display panel 12 in the second state are different in terms of the first direction, it is possible to prevent the viewer from sensing the difference of horizontal curvatures among different portions of the display panel 12 or suffering from inconvenience in watching.

In this case, in the second state, assuming that the difference of horizontal curvatures (or radii of horizontal curvature) between the center portion and the edge portion of the display panel 12 in terms of the second direction (more particularly, along a horizontal center axis of the display panel 12) is a first difference, and the difference of horizontal curvatures (or radii of horizontal curvature) between the center portion and the edge portion of the display panel 12 in terms of the first direction (more particularly, along a vertical center axis of the display panel 12) is a second difference, the first difference may be greater than the second difference. The first difference greater than the second difference may enhance immersiveness and minimize watching hindrance because the difference of horizontal curvatures (or radii of horizontal curvature) in terms of the second direction is more meaningful in consideration of immersiveness, watching hindrance, and the like.

Considering the above description in more detail, assuming that the display panel 12 is divided into a plurality of virtual areas in the second state, at least two virtual areas may have different average horizontal curvatures. That is, the display panel 12 may be defined by a plurality of virtual areas having a constant size and the average horizontal curvature of each virtual area may be referred to as a horizontal curvature.

As exemplarily shown in FIG. 5, the plurality of virtual areas may include a first row 111 corresponding to an area that includes the center of the display panel 12 and extends in the second direction, and second rows 112 corresponding to areas that include both edges (more particularly, the upper edge and the lower edge) of the display panel 12 and extend in the second direction, the second rows being located one above another in the first direction. In turn, the first row 111 and the second row 112 each includes a first column 101 including the center portion of the display panel 10, and second columns 102 including both edge portions (more particularly, the left edge portion and the right edge portion) of the display panel 12, the second columns 102 being arranged side by side in the second direction. In addition, at least one third column 103 and more particularly, a plurality of third columns 103 may be located between the first column 101 and each second column 102.

In this case, in the second state, on the basis of the first row 111, a horizontal curvature of the first column 101 may be greater than a horizontal curvature of the second column 102. That is, the first column 101 of the first row 111 may have a relatively small first radius of horizontal curvature R1, and the second column 102 of the row line 111 may have a greater radius of horizontal curvature R2 than the first radius of horizontal curvature R1.

For example, the first radius of horizontal curvature R1 may be within a range of 1000 mm to 6000 mm, and the second radius of horizontal curvature R2 may be greater than the first radius of horizontal curvature R1 and be 5000 mm or more. When the first radius of horizontal curvature R1 is below 1000 mm, the center portion of the display panel 12 is excessively bent, thus causing inconvenience in watching by the user. When the first radius of horizontal curvature R1 exceeds 6000 mm, enhancement of immersiveness caused by bending of the display panel 12 may not be great. When the second radius of horizontal curvature R2 is below 5000 mm, the edge portion of the display panel 12 may be excessively bent, thus hindering watching by the user. The upper limit of the second radius of horizontal curvature R2 is not limited, and the second radius of horizontal curvature R2 may have an infinite value to allow the edge portion of the display panel 12 to be flat without having a curvature. However, the present invention is not limited thereto, and the first and second radii of horizontal curvature R1 and R2 may have various other values.

In addition, in the second state, on the basis of the first row 111, the third columns 103 may have horizontal curvatures that are less than horizontal curvature of the first column 101 and greater than horizontal curvature of the second column 102. In this case, the horizontal curvatures of the third columns 103 may be gradually reduced with increasing distance from the third column 103 proximate to the first column 101 or decreasing distance to the third column 103 proximate to the second column 102. That is, in the second state, the third columns 103 of the first row 111 may have different third radii of horizontal curvatures R31, R32, and R33 that are greater than the first radius of horizontal curvature R1 and less than the second radius of horizontal curvature R2. In this case, the radius of horizontal curvature R31 may be greater than the first radius of horizontal curvature R1 and less than the radius of horizontal curvature R32, the radius of horizontal curvature R32 may be greater than the radius of horizontal curvature R31 and less than the radius of horizontal curvature R33, and the radius of horizontal curvature R33 may be greater than the radius of horizontal curvature R32 and less than the second radius of horizontal curvature R2. In this way, in the second state, on the basis of the first row 111, the radii of horizontal curvature of the third columns 103 may be gradually increased in the manner of R31<R32<R33 such that the third column 103 proximate to the second column 101 has the greatest horizontal curvature and the third column 103 proximate to the second column 102 has the smallest horizontal curvature.

In addition, in the second state, on the basis of the second row 112, a horizontal curvature of the first column 101 may be greater than a horizontal curvature of the second column 102. That is, the first column 101 of the second row 112 may have a relatively small fourth radius of horizontal curvature R4, and the second column 102 of the second row 112 may have a fifth radius of horizontal curvature R5 greater than the fourth radius R4 of horizontal curvature.

For example, the fourth radius of horizontal curvature R4 may be within a range of 500 mm to 5500 mm, and the fifth radius of horizontal curvature R5 may be greater than the fourth radius of horizontal curvature R4, and more particularly, may be 5000 mm or more. When the fourth radius of horizontal curvature R4 is below 500 mm, the center portion of the display panel 12 may be excessively bent, causing watching inconvenience. When the fourth radius of horizontal curvature R4 exceeds 5500 mm, enhancement of immersiveness caused by bending of the display panel 12 may not be great. When the fifth radius of horizontal curvature R5 is below 5000 mm, the edge portion of the display panel 12 may be excessively bent, thus hindering watching by the user. The upper limit of the fifth radius of horizontal curvature R5 is not limited, and the fifth radius of horizontal curvature R5 may have an infinite value to allow the edge portion of the display panel 12 to be flat without having a curvature. R5 may be same or less than R2. However, the present invention is not limited thereto, and the fourth and fifth radii of horizontal curvatures R4 and R5 may have various other values.

In addition, in the second state, on the basis of the second row 112, the third columns 103 may have different horizontal curvatures that are less than a horizontal curvature of the first column 101 and greater than a horizontal curvature of the second column 102. In this case, the horizontal curvature may be gradually reduced with increasing distance from the third column 103 proximate to the first column 101 or decreasing distance to the third column 103 proximate to the second column 102. That is, in the second state, the third columns 103 of the second row 112 may have different sixth radii of horizontal curvatures R61, R62, and R63 that are greater than the fourth radius of horizontal curvature R4 and less than the fifth radius of horizontal curvature R5. In this case, the radius of horizontal curvature R61 may be greater than the fourth radius of horizontal curvature R4 and less than the radius of horizontal curvature R62, the radius of horizontal curvature R62 may be greater than the radius of horizontal curvature R61 and less than the radius of horizontal curvature R63, and the radius of horizontal curvature R63 may be greater than the radius of horizontal curvature R62 and less than the fifth radius of horizontal curvature R5. In this way, in the second state, on the basis of the second row 112, the radii of horizontal curvature of the third columns 103 may be gradually increased in the manner of R61<R62<R63 such that the third column 103 proximate to the first column 101 has the smallest radius of horizontal curvature and the third column 103 proximate to the second column 102 has the greatest radius of horizontal curvature.

In addition, in the second state, on the basis of the first column 101, a horizontal curvature of the second row 112 may be equal to or greater than a horizontal curvature of the first row 111. That is, in the second state, the fourth radius of horizontal curvature R4 of the first column 101 of the second row 112 may be equal to or less than the first radius of horizontal curvature R1 of the first column 101 of the first row 111. This is performed by the first and second variable members 210 and 220 positioned to correspond to the edge portions (more particularly, the upper edge portion and the lower edge portion) of the display panel 12 as described above.

Similarly, in the second state, on the basis of the second column 102, a horizontal curvature of the second row 112 may be equal to or greater than a horizontal curvature of the first row 111. That is, in the second state, the fifth radius of horizontal curvature R5 of the second column 102 of the second row 112 may be equal to or less than the second radius of horizontal curvature R2 of the second column 102 of the first row 111. In one instance, the entire second column 102 may have no curvature and be flat. However, the present invention is not limited thereto, and various other alterations are possible.

Similarly, in the second state, on the basis of the third columns 103, a horizontal curvature of the second row 112 may be equal to or greater than a horizontal curvature of the first row 111. That is, in the second state, the sixth radii of horizontal curvature R61, R62, and R63 of the third columns 103 of the second row 112 may be equal to or less than the third radii of horizontal curvature R31, R32, and R33 of the third columns 103 of the first row 111.

As described above, on the basis of corresponding positions (i.e., the same column) of the rows 111 and 112, a horizontal curvature of the second row 112 may be equal to or greater than a horizontal curvature of the first row 111. However, the present invention is not limited thereto, and the horizontal curvature may vary according to positions of the first and second variable members 210 and 220, and the like.

In the present embodiment, assuming that the difference of horizontal curvatures of the first column 101 and the second column 102 of the first row 111 is a first difference and the difference of horizontal curvatures of the first row 111 and the second row 112 of the first column 101 is a second difference, the first difference may be greater than the second difference. That is, assuming that the difference of radii of horizontal curvature of the first column 101 and the second column 102 of the first row 111 (i.e., the difference of the first radius of horizontal curvature R1 and the second radius of horizontal curvature R2) is a first difference and the difference of radii of horizontal curvature of the first row 111 and the second row 112 of the first column 101 (i.e., the difference of the first radius of horizontal curvature R1 and the fourth radius of horizontal curvature R4) is a second difference, the first difference may be greater than the second difference. That is, in the present embodiment, the difference of horizontal curvatures (or radii of horizontal curvature) in the second direction is greater than the difference of horizontal curvatures (or radii of horizontal curvature) in the first direction. Increasing the difference of horizontal curvatures in the second direction that is directly associated with watching hindrance may minimize the degree of watching hindrance due to a horizontal curvature.

Although the drawing and the description illustrate provision of three third columns 103, the present invention is not limited thereto. The number of third columns 103 may be altered in various ways. In addition, although the drawing and the description illustrate provision of the first row 111 and the second row 112, an additional row may be provided between the first row 111 and the second row 112. Even in the additional row, a horizontal curvature thereof may be gradually reduced in the sequence of the first column 101, the third column 103, and the second column 102. In addition, on the basis of the same column, a horizontal curvature of the additional row between the first row and the second row may be gradually increased with increasing distance from the first row or decreasing distance to the second row.

Although not shown in the drawing in detail, in the second state, the display panel 12 may have a vertical curvature (i.e., a curvature in a cross section (the yz plane of the drawing) perpendicular to the second direction). With the existence of the vertical curvature, on the basis of the first column 101, the vertical curvature may be significantly less than the horizontal curvature. Alternatively, in the first state and the second state, the display panel 12 may have a flat cross section without a vertical curvature.

In the second state, the variable member 20 may also be bent with a horizontal curvature. In the second state, a horizontal curvature of a center portion (corresponding to the inner ends of the first and second parts 21 and 22) of the variable member 20 may be greater than a horizontal curvature of an edge portion of the variable member 20. This is because the drive unit 30 is located at the center portion of the variable member 20 to push the first and second parts 21 and 22 away from each other, and thus there may be an occurrence of greater displacement at the center portion.

Through the display device 100 in accordance with the present embodiment as described above, in the second curved state, at least two portions (or two virtual areas) of the display panel 12 may be bent with different curvatures (e.g., horizontal curvatures in a cross section perpendicular to the first direction). For instance, as a result of allowing the center portion of the display panel 12 to be more greatly bent in the second direction crossing the first direction to achieve a greater horizontal curvature, enhanced immersiveness may be accomplished. Furthermore, owing to less or no bending of the edge portion of the display panel 12, it is possible to minimize the edge portion from hindering watching. In addition, by optimizing a position of the variable member 20 that varies the shape of the display panel 12, the display panel 12 may be bent in the first direction such that a horizontal curvature of the edge portion thereof is equal to or greater than a horizontal curvature of the center portion thereof. In this way, effective transformation of the entire display panel 12 may be accomplished using a reduced number of variable members 20, and a sufficient space for installation of the panel drive unit may be accomplished.

The above described features, configurations and methods are included in at least one of the embodiments of the present invention, and should not be limited to only one embodiment. In addition, the features, configurations and methods as illustrated in each embodiment may be implemented with regard to other embodiments as they are combined with one another or modified by those skilled in the art. Accordingly, content related to these combinations and modifications should be construed as being included in the scope and spirit of the invention.

What is claimed is:

1. A display apparatus comprising: a display module comprising a display panel to display an image, wherein the display module having at least a first state and a second state being more bent than the first state, and the display module is bent in a cross section perpendicular to a first direction in the second state; and a variable member fixed to a rear surface of the display module and applying a first force and a second force to both edge portions of the display module respectively; the first and second forces are in opposite directions along a second direction perpendicular the first direction in the cross section to transform a shape of the display module from the first state to the second state, wherein, if an area including a center of the display module and extending in the first direction is a first column, and a curvature of the display module in the second direction in the second state is, at both edge portions of the first column in the first direction, different from that at a center portion of the first column located between the both edge portions of the first column, wherein the variable member includes: a first variable member extending lengthwise in the second direction crossing one of the both edge portions of the first column; and a second variable member extending lengthwise in the second direction crossing the other of the both edge portions of the first column.

2. The display apparatus according to claim 1, wherein the first direction corresponds to a vertical height direction of the display module and the second direction corresponds to a horizontal direction of the display module.

3. The display apparatus according to claim 1, wherein the curvature of the display module in the second state is, at the both edge portions of the first column, greater than that at the center portion of the first column.

4. The display apparatus according to claim 1, wherein the curvature of the display module in the second state is gradually increased with increasing distance in the first direction from the center portion of the first column or decreasing distance in the first direction to the both edge portions of the first column.

5. The display apparatus according to claim 1, wherein, if an area including the center of the display module and extending in the second direction is a first row, and
   if, in the second state, a difference of curvatures in the second direction between a center portion and an edge portion of the display module in the first row in the second direction is a first difference, and a difference of curvatures in the second direction between a center portion and an edge portion of the display module in the first column in the first direction is a second difference, the first difference is greater than the second difference.

6. The display apparatus according to claim 1, further comprising:
   a drive unit disposed on the center portion in the second direction of the rear surface of the display module.

7. The display apparatus according to claim 6, wherein the variable member comprises a first part and a second part spaced apart from each other while interposing the drive unit,
   wherein a first end of the first part is connected to one side of the drive unit, and
   wherein a first end of the second part is connected to the other side of the drive unit.

8. The display apparatus according to claim 7, wherein a second end of the first part opposite to the first end of the first part and proximate to one of the both edge portions is secured to the display module, and
   wherein a second end of the second part opposite to the first end of the second part and proximate to the other of the both edge portions of the display module is secured to the display module.

9. The display apparatus according to claim 8, wherein each of the second ends of the first part and the second part is immovably secured to the display module.

10. The display apparatus according to claim 9, wherein each of the second ends of the first part and the second part is secured to the display module using a fastening member.

11. The display apparatus according to claim 10, wherein the fastening member comprises at least one of a PEM nut, a screw, and a bolt.

12. The display apparatus according to claim 7, further comprising:
a guide member provided on each of the first and second parts, the guide member serving to movably secure the first and second parts to the display module.

13. The display apparatus according to claim 1,
wherein the display module further comprises a support member provided on a rear surface of the display panel between the display panel and the variable member to support the display panel.

14. The display apparatus according to claim 1, wherein the curvature of the display module in the second state is less, at both edge portions of the display module in the second direction, than that at a center portion of the display module in the second direction.

15. The display apparatus according to claim 14, wherein the curvature of the display module in the second state is gradually reduced with increasing distance in the second direction from the center portion of the display module or decreasing distance in the second direction to each of the both edge portions of the display module.

16. The display apparatus according to claim 14, wherein the both edge portions in the second direction are flat.

17. The display apparatus according to claim 1, wherein, if each of areas including each of the both edge portions of the first column and extending in the second direction are both second rows, and
the first variable member is disposed along one of the both second rows, and
the second variable member is disposed along the other of the both second rows.

* * * * *